United States Patent [19]
Weiss

[11] Patent Number: 4,492,880
[45] Date of Patent: Jan. 8, 1985

[54] DRIVER CIRCUIT
[75] Inventor: Harold Weiss, Framingham, Mass.
[73] Assignee: Parker Manufacturing Company, Worcester, Mass.
[21] Appl. No.: 520,412
[22] Filed: Aug. 4, 1983
[51] Int. Cl.³ ............................................. H03K 17/72
[52] U.S. Cl. ............................. 307/252 N; 307/247 A; 361/3; 361/186; 361/205
[58] Field of Search ............ 307/252 R, 252 N, 252 J, 307/252 VA, 247 A, 261, 273; 361/3, 6, 186, 205

[56] References Cited
U.S. PATENT DOCUMENTS

| | | | |
|---|---|---|---|
| 3,345,546 | 10/1967 | Beitramo | 307/252 N |
| 3,621,296 | 11/1971 | Berger | 307/252 N |
| 3,662,190 | 5/1972 | Naber | 307/252 N |
| 3,846,648 | 11/1974 | Scott | 307/252 N |
| 4,333,019 | 6/1982 | Weigert | 361/205 |
| 4,449,161 | 5/1984 | Kling | 361/205 |

Primary Examiner—John Zazworsky
Attorney, Agent, or Firm—Thompson, Birch, Gauthier & Samuels

[57] ABSTRACT

A driver circuit which is responsive to an input AC voltage for providing a drive signal to a load circuit for each activation of a switch. A triggering signal generated by a trigger circuit in response to the activation of the switch energizes a timing circuit during a negative cycle of the input voltage. A control signal from the timing circuit energizes a firing circuit for a selected time period. The drive signal is applied to the load circuit during the time interval in which the firing circuit is energized by the timing circuit.

19 Claims, 6 Drawing Figures

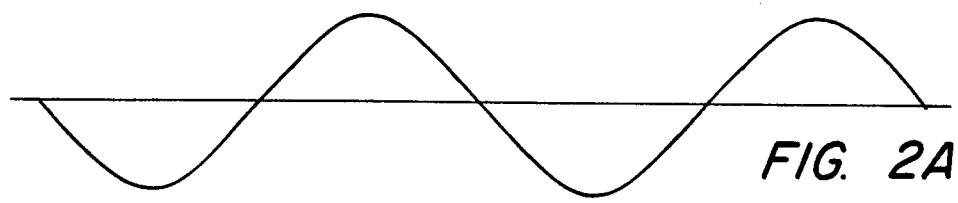
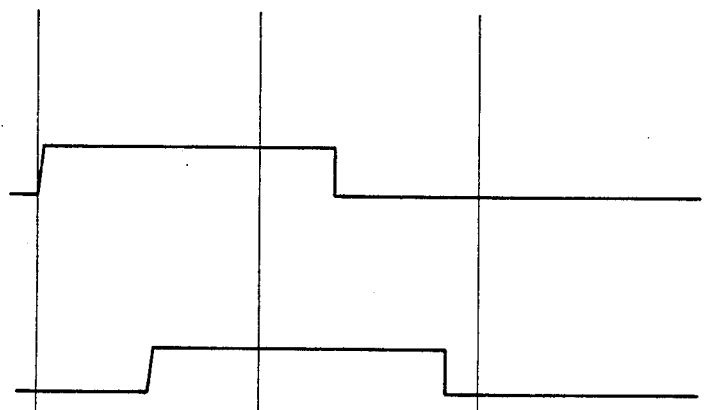
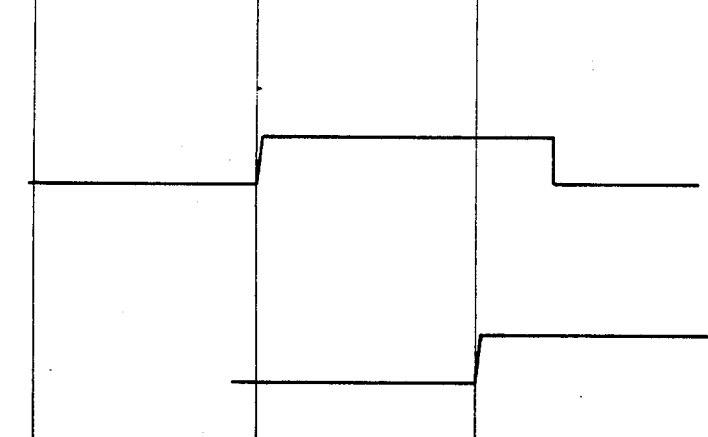
FIG. 2A
FIG. 2B
FIG. 2C
FIG. 2D
FIG. 2E

DRIVER CIRCUIT

BACKGROUND OF THE INVENTION

1. Field of the Invention

The present invention relates to driver circuits and, more particularly, is directed towards driver circuits for electric staplers and the like.

2. Background of the Invention

A variety of control circuits have been designed for actuating electrically operated stapling devices. For example, U.S. Pat. No. 4,333,019 discloses a silicon controlled rectifier driver circuit for an electric stapler. The patented driver circuit is responsive to an input AC voltage and is designed to provide at least one drive pulse to the stapler's load circuit for each activation of the stapler's trigger switch. Under certain conditions of high line noise, such as power tools on the line, a drive pulse may fire the patented stapler even though the trigger switch has not been activated. Furthermore, prior art stapler driver circuits suffer from the disadvantage of multiple firings within a fraction of a second because of switch bounce or multiple activations of the switch. Firing for multiple cycles of the line voltage causes overheating. A need has arisen for an improved driver circuit.

SUMMARY OF THE INVENTION

It is an object of the invention to provide an improved driver circuit.

It is another object of the invention to provide an improved driver circuit for an electric stapler.

A further object of the invention is to provide a driver circuit which is responsive to an input AC line voltage for providing a drive signal to a load circuit in response to activation of a trigger switch. The driver circuit is particularly suitable for generating a drive signal for energizing an electric stapler load circuit. The line voltage is rectified and applied to a trigger circuit which generates a triggering signal when the trigger switch is activated and during such time that the input AC line voltage is in a negative portion of its cycle. A timing circuit, which is responsive to the triggering signal, generates a control signal for a selected time period related to one cycle of the input AC line voltage. A firing circuit is energized for a selected time period by the control signal. The drive signal is applied to the load circuit for the time period during which the firing circuit is energized by the timing circuit.

BRIEF DESCRIPTION OF THE DRAWINGS

The above and other objects, features and advantages of the present invention will become apparent upon consideration of the following detailed description taken in conjunction with the accompanying drawings, wherein.

DETAILED DESCRIPTION OF THE PREFERRED EMBODIMENTS

Figure 1:
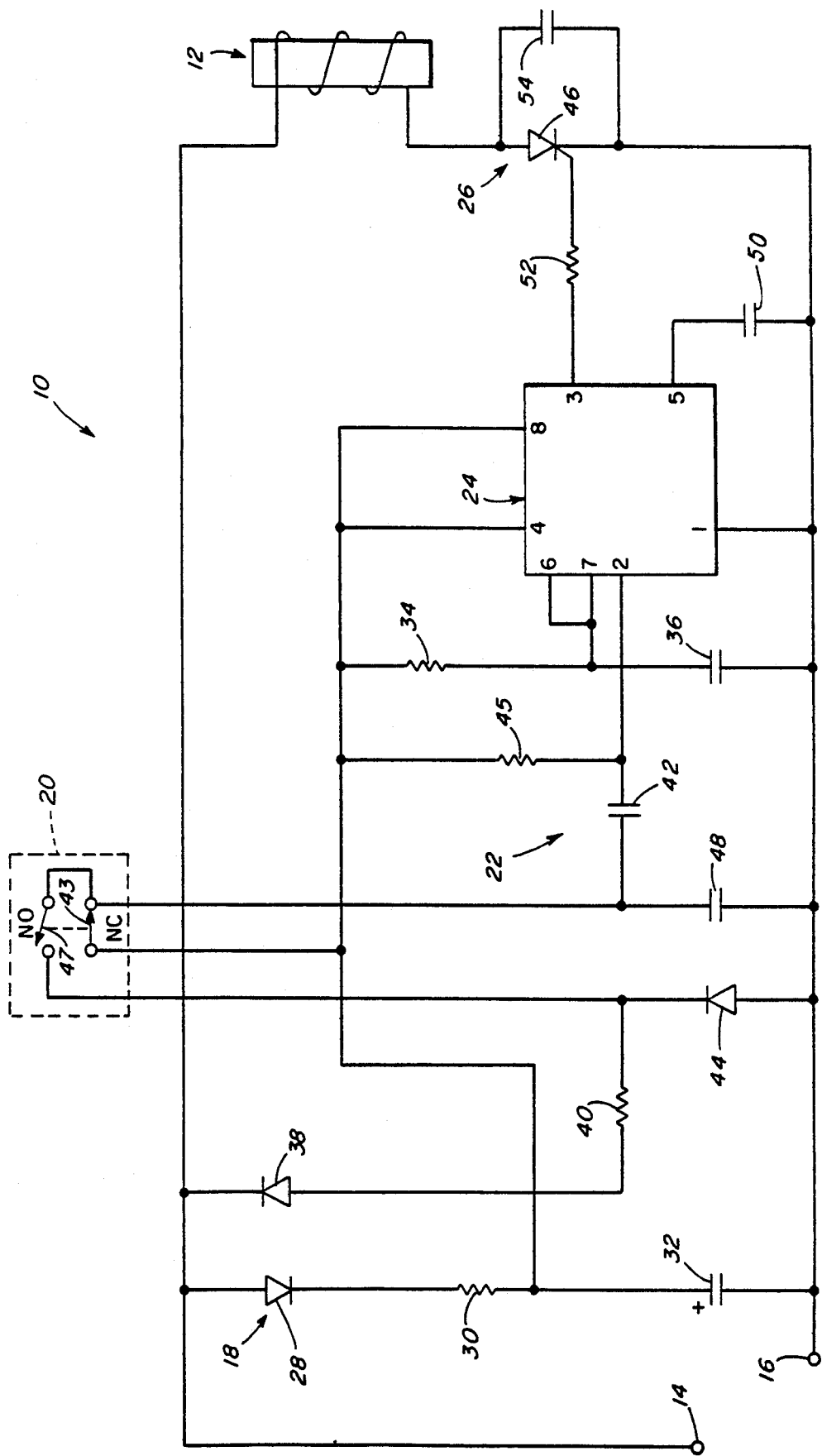
FIG. 1 is a circuit diagram of the driver circuit embodying the present invention; and, FIGS. 2A, 2B, 2C, 2D and 2E are waveforms illustrating certain principles of the invention.

Referring now to the drawings, particularly FIG. 1, there is shown a driver circuit 10 embodying the present invention for providing a drive signal to a load circuit 12, for example the coil of an electric stapler. Driver circuit 10 includes a pair of input terminals 14 and 16 for receiving an input AC line voltage, for example 115 volts 60 cycles. A rectifier circuit 18, which is connected across the input terminals 14 and 16, provides a DC voltage from the input AC line voltage. The DC voltage is applied through a switch 20 to a trigger circuit 22 which generates a triggering signal during a negative portion of the input AC line voltage cycle. A timing circuit 24, which receives the triggering signal, generates a control signal for a selected time period related to one cycle of the input AC line voltage. The control signal fires a firing circuit 26 which, in turn, provides the drive signal to load circuit 12 for the time period determined by the timing circuit 24.

As previously indicated, the input AC line voltage is applied to the rectifier circuit 18 through terminals 14 and 16. Rectifier circuit 18 includes a diode 28 which rectifies the input AC line voltage and provides a positive DC supply voltage. The anode of diode 28 is connected to terminal 14 and the cathode is connected to one side of a dropping resistor 30. A filter 32, for example a capacitor, is connected between the other side of resistor 30 and terminal 16. The voltage at the junction of resistor 30 and capacitor 32, which is approximately positive 14 volts for a nominal line voltage of 115 V AC, is applied to the timing circuit 24, for example a 555 integrated circuit timer which is operated as a one shot. The time period during which the one shot 24 remains ON is determined by a resistor 34 and a capacitor 36 which are connected in series across capacitor 32, the junction of resistor 34 and capacitor 36 being connected to jumpered pins "6" and "7" of the one shot.

As hereinafter described, the triggering signal applied to pin "2" of the one shot 24 is formed by means of a diode 38, a resistor 40 and capacitors 42 and 48. The triggering signal is generated only during the negative portion of the input AC line voltage cycle. The voltage at the junction of resistor 30 and capacitor 32 is fed to capacitor 42 via the normally closed (NC) contacts 43 of switch 20 and to pin "2" of one shot 24 through a resistor 45. When switch 20 is energized, the NC contacts 43 open and the normally open (NO) contacts 47 close. Preferably, switch 20 is a single pole, normally closed, single throw switch with contacts 47 replaced by a permanent connection. During the negative excursion of the input line voltage, diode 38 conducts and tends to establish a very negative voltage at the junction of resistor 40 and a diode 44. However, diode 44 acts as a clamp which prevents the voltage at the junction of resistor 40 and diode 44 from going below 0 volts. When NC contacts 43 open, capacitor 48, which is charged to a positive 14 volts, will try to discharge very quickly through the closed NO contacts 47 during the negative cycle of the line voltage or on the next negative cycle of the line voltage if the line voltage is currently on its positive cycle. However, since diode 44 clamps the voltage to 0 volts, the voltage will drop from positive 14 volts to 0 volts or ground. This drop in voltage will cause the voltage on the other side of capacitor 42 to drop from positive 14 volts to ground. It is this drop in voltage which provides the trigger pulse at pin "2" for energizing one shot 24. When one shot 24 is turned ON, the voltage at output pin "3" is approximately positive 14 volts. As hereinafter described, one shot 24 remains ON for a period of time which is related to one cycle of the input AC line voltage. In the illustrated embodiment, one shot 24 stays on for a time period of between 8.3 and 16.6 milliseconds. The input AC line voltage waveform is shown in FIG. 2A and the one shot 24 ON time waveforms are shown in FIGS. 2B–2E.

As previously indicated, the drive signal is initiated only during the negative portions of the line voltage cycles. If switch 20, for example an electric stapler trigger switch, is squeezed at the very beginning of the negative portion of the input AC line voltage cycle as shown in FIG. 2B, one shot 24 will turn ON immediately and its output control signal will last into the positive portion of the line voltage cycle. FIG. 2C shows activation of trigger switch 20 during the middle of the negative portion of the line voltage cycle and the waveform of FIG. 2D represents activation of the trigger switch at the end of the negative cycle. FIG. 2E shows the ON time waveform of one shot 24 when trigger switch 20 is activated during the positive portion of the line voltage cycle.

When trigger switch 20 is actuated during the negative portion of the input AC line voltage cycle as shown in FIGS. 2B, 2C and 2D, one shot 24 will turn ON immediately. The reason that one shot 24 fires immediately is that the junction point of resistor 40 and diode 44 will drop from a positive 14 volts towards 0 volts when NC contacts 47 are closed during the negative portion of the input AC line voltage cycle. In consequence, the voltage at the junction of capacitor 42 and switch 20 also drops towards 0 and one shot 24 is triggered ON. That is, the voltage at the side of capacitor 42 which is connected to trigger input pin "2" of one shot 24 will quickly drop from positive 14 volts to ground. This sudden voltage drop or trigger pulse at pin "2" triggers one shot 24. When the one shot 24 is turned ON, silicon control rectifier (SCR) 46 in firing circuit 26 fires. The current which flows through SCR 46 constitutes the drive signal for coil 12.

One shot 24 has to remain ON long enough so that SCR 46 will be ON during the next positive half cycle. Once SCR 46 starts to conduct on the next positive half cycle, it stays ON until the voltage on its anode is removed. Therefore, one shot 24 has to have a duration which is greater than half the power line cycle to satisfy this requirement. When one shot 24 is turned ON at the very trailing edge of the negative portion of the AC power line voltage cycle as shown in FIG. 2D, SCR 46 is fired immediately. SCR 46 remains ON during that whole positive cycle. However, if one shot 24 remains ON for more than one cycle, SCR 46 would be turned ON a second time. This would be an undesirable condition which could result in overheating. Therefore, the time period during which one shot 24 remains ON must be greater than half the input AC line voltage cycle (8.33 milliseconds) and less than one complete cycle of the input AC line voltage (16.66 milliseconds).

As previously discussed in connection with FIG. 2E, when switch 20 is open during the positive portion of the input AC line voltage cycle, no current flows through resistor 40 and the voltage at the junction of capacitor 42 and switch 20 remains at 14 volts. No current flows through resistor 40 because diode 38 does not conduct during the positive portion of the input AC line voltage cycle. As soon as the negative portion of the cycle begins, the voltage at the junction of switch 20 and capacitor 42 drops and one shot 24 is turned ON. Capacitor 48, which is connected between terminal 16 and the junction of capacitor 42 and switch 20, is provided so that the voltage remains at positive 14 volts when the switch is activated during the positive cycle of the input AC line voltage. A capacitor 50, which is connected between pin "5" of one shot 24 and terminal 16, is a filter which is required for proper operation of the one shot. A resistor 52, which is connected between output pin "3" of one shot 24 and SCR 46, limits the output current of the control signal which is applied to the trigger input of the SCR. A capacitor 54 connected across SCR 46 eliminates high voltage spikes and any radio frequency signals from crossing the SCR and prevents SCR firing or triggering due to noise on the line.

Since certain changes may be made in the foregoing disclosure without departing from the scope of the invention herein involved, it is intended that all matter contained in the above description and depicted in the accompanying drawings be construed in an illustrative and not in a limiting sense.

What is claimed is:

1. A driver circuit which is responsive to an input AC line voltage for providing a drive signal to a load circuit, said driver circuit comprising:
   (a) means for receiving the input AC voltage;
   (b) means for providing a DC voltage related to the input AC voltage;
   (c) switch means connected to said DC voltage means, said switch means having first and second states;
   (d) trigger means connected to said switch means, said trigger means charged to a voltage related to the DC voltage when said switch means is in said first state, said trigger means generating a triggering signal during such time that the input AC voltage is in a negative portion of its cycle and said switch means is in said second state;
   (e) timing means responsive to said triggering signal for generating a control signal for a selected time period which is related to one cycle of the input AC voltage; and
   (f) firing means responsive to said timing means for providing the drive signal to the load circuit, said firing means providing the drive signal when the control signal is applied to said firing means.

2. The driver circuit as claimed in claim 1 wherein said timing means is an integrated circuit timer.

3. The driver circuit as claimed in claim 2 wherein said integrated circuit timer is a one shot having ON and OFF states, said one shot energized to its ON state by said switch means.

4. The driver circuit as claimed in claim 3 including one shot timing means for setting the time period during which said one shot remains in its ON state.

5. The driver circuit as claimed in claim 4 wherein the time period set by said one shot timing means during which said one shot remains in its ON state is in the range of 50% to 100% of the time period of one cycle of the input AC line voltage.

6. The driver circuit as claimed in claim 1 wherein said switch means is a single pole, single throw switch.

7. The driver circuit as claimed in claim 1 wherein said trigger means includes a diode and a capacitor, said diode permitting said capacitor to discharge during the negative portion of the input AC line voltage, said capacitor being discharged when said switch means is actuated, said capacitor connected to a trigger input of said timing means, the discharging of said capacitor causing a trigger pulse to be presented at the trigger input of said timing means only during the negative portion of the input AC line voltage cycle.

8. The driver circuit as claimed in claim 1 wherein said firing means includes a silicon controlled rectifier 9. The driver circuit as claimed in claim 8 wherein said silicon controlled rectifier is connected in series with the load circuit, current flowing through the load circuit when said silicon controlled rectifier is turned ON.

10. The driver circuit as claimed in claim 9 wherein said firing means includes a capacitor connected in parallel with said silicon controlled rectifier.

11. For use with an electric stapler having a load circuit, a driver circuit which is responsive to an input AC line voltage for providing a drive signal to the load circuit of the electric stapler for driving a staple, said driver circuit comprising:
(a) means for receiving an input AC line voltage;
(b) means for providing a DC voltage related to the input AC line voltage;
(c) single pole, single throw switch means connected to said DC voltage means, said switch means having first and second states;
(d) trigger means connected to said switch means, said trigger means generating a triggering signal during the time period when the input AC line voltage is in a negative portion of its cycle and said switch means is in said second state;
(e) integrated circuit timing means responsive to said triggering signal for generating a control signal for a selected time period which has a duration in the range of 50% to 100% of the time period of one cycle of the input AC line voltage; and
(f) firing means responsive to said timing means for providing the drive signal to the load circuit, said firing means providing the drive signal to the load circuit during the time period when the control signal is applied to said firing means.

12. The driver circuit as claimed in claim 11 wherein said integrated circuit timing means is a one shot having ON and OFF states, said one shot being energized to its ON state when said switch means is in said second state and the negative portion of the input AC line is presented to said trigger means.

13. The driver circuit as claimed in claim 12 including one shot timing means for setting the time period during which said one shot remains in its ON state after having been energized by said triggering signal.

14. The driver circuit as claimed in claim 13 wherein the time period set by said one shot timing means during which said one shot remains in its ON state is in the range of 50% to 100% of one cycle of the input AC line voltage.

15. The driver circuit as claimed in claim 14 wherein said trigger means includes a capacitor which is discharged when said single pole, single throw switch means is actuated and a negative portion of the input AC line voltage is presented to said trigger means, said capacitor being connected to a trigger input of said timing means, the discharging of said capacitor causing a trigger pulse to be presented at the trigger input of said timing means only during the negative portion of the input AC line voltage cycle.

16. The driver circuit as claimed in claim 11 wherein said firing means includes a silicon controlled rectifier which is connected in series with the load circuit, current flowing through the load circuit when said silicon controlled rectifier is turned ON.

17. A driver circuit which is responsive to an input AC line voltage for providing a drive signal to a load circuit, said driver circuit comprising:
(a) means for receiving the input AC voltage;
(b) means for providing a DC voltage related to the input AC voltage;
(c) switch means connected to said DC voltage means, said switch means having first and second states;
(d) trigger means connected to said switch means, said trigger means generating a triggering signal during the time period when the input AC line voltage is in a negative portion of its cycle and said switch means is in said second state;
(e) integrated circuit timer means responsive to said triggering signal for generating a control signal for a selected time period which has a duration related to one cycle of the input AC voltage, said trigger means presenting a first voltage to said integrated circuit timer means when said switch means is in said first state and the AC line voltage is in the positive portion of its cycle and presenting a second voltage to said integrated circuit timer means when said switch means is in said second state and the input AC line voltage is in the negative portion of its cycle, the first voltage being related to the DC voltage, the first voltage and the second voltage being at different voltage potentials so that the triggering signal is presented at said integrated circuit timer means when the first voltage and the second voltage are sequentially presented at said integrated circuit timer means; and
(f) silicon controlled rectifier firing means responsive to said integrated circuit timer means for providing the drive signal to the load circuit, said firing means providing the drive signal to the load circuit during the time period when the control signal is applied to said firing means.

18. The driver circuit as claimed in claim 17 wherein said integrated circuit timer means is a one shot and includes one shot timing means for setting a predetermined time period during which said one shot is in an ON state, said predetermined time period having a duration which is equal to or greater than the duration of one half cycle of the line voltage and equal to or less than the duration of one complete cycle of the line voltage, said one shot being energized to its ON state when said triggering signal is presented to said integrated circuit timer means.

19. The driver circuit as claimed in claim 18 wherein said trigger means includes a diode and a capacitor, said capacitor being discharged when said switch means is actuated, said diode limiting discharge of said capacitor to periods of time when a negative portion of the input AC line voltage is presented to said trigger means, said capacitor being connected to a trigger input of said one shot, the discharging of said capacitor causing a trigger pulse to be presented at the trigger input of said one shot.

* * * * *